(12) United States Patent
Kanda

(10) Patent No.: US 7,382,675 B2
(45) Date of Patent: Jun. 3, 2008

(54) SEMICONDUCTOR MEMORY DEVICE

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/472,360

(22) Filed: Jun. 22, 2006

(65) Prior Publication Data

US 2006/0291124 A1  Dec. 28, 2006

(30) Foreign Application Priority Data

Jun. 23, 2005  (JP) .............................. 2005-183237

(51) Int. Cl.
 *G11C 5/14* (2006.01)
 *G11C 7/00* (2006.01)
 *G11C 11/34* (2006.01)
(52) U.S. Cl. ............... 365/226; 365/200; 365/225.7; 365/189.07; 365/185.09; 365/185.17; 365/185.33
(58) Field of Classification Search ............... 365/226, 365/200, 225.7, 185.09, 185.17, 185.21, 365/185.23, 185.29, 185.33, 189.07
See application file for complete search history.

(56) References Cited

U.S. PATENT DOCUMENTS

| | | | |
|---|---|---|---|
| 5,208,780 A * | 5/1993 | Iwase et al. ............. | 365/225.7 |
| 5,258,947 A * | 11/1993 | Sourgen ................... | 365/225.7 |
| 5,661,323 A * | 8/1997 | Choi et al. ............... | 365/225.7 |
| 5,898,615 A * | 4/1999 | Chida ..................... | 365/185.17 |
| 6,108,246 A * | 8/2000 | Umezawa et al. ..... | 365/189.09 |
| 6,449,207 B2 * | 9/2002 | Sher et al. ................. | 365/226 |
| 6,680,873 B2 * | 1/2004 | Muraoka et al. ......... | 365/225.7 |
| 6,700,817 B2 * | 3/2004 | Atsumi et al. ......... | 365/185.09 |
| 6,937,514 B2 | 8/2005 | Hasegawa | |
| 6,970,394 B2 * | 11/2005 | Wu et al. ................. | 365/225.7 |
| 7,116,603 B2 * | 10/2006 | Kanda et al. ............ | 365/225.7 |
| 7,248,529 B2 * | 7/2007 | Kamiya et al. .......... | 365/225.7 |
| 2004/0120204 A1 | 6/2004 | Kanda et al. | |

FOREIGN PATENT DOCUMENTS

JP  2003-196993  7/2003

\* cited by examiner

*Primary Examiner*—Trong Phan
(74) *Attorney, Agent, or Firm*—Oblon, Spivak, McClelland, Maier & Neustadt, P.C.

(57) ABSTRACT

According to an aspect of the invention, there is provided a semiconductor memory device including a first power source which generates a first power supply voltage, a second power source which generates a second power supply voltage, a generation circuit which generates a third power supply voltage from the first power supply voltage, a switching circuit which selects one of the second power supply voltage and the third power supply voltage, and a fuse circuit connected to the switching circuit and equipped with a fuse element to carry out a fuse reading operation, wherein the third power supply voltage is supplied from the switching circuit to the fuse circuit during the fuse reading operation.

21 Claims, 10 Drawing Sheets

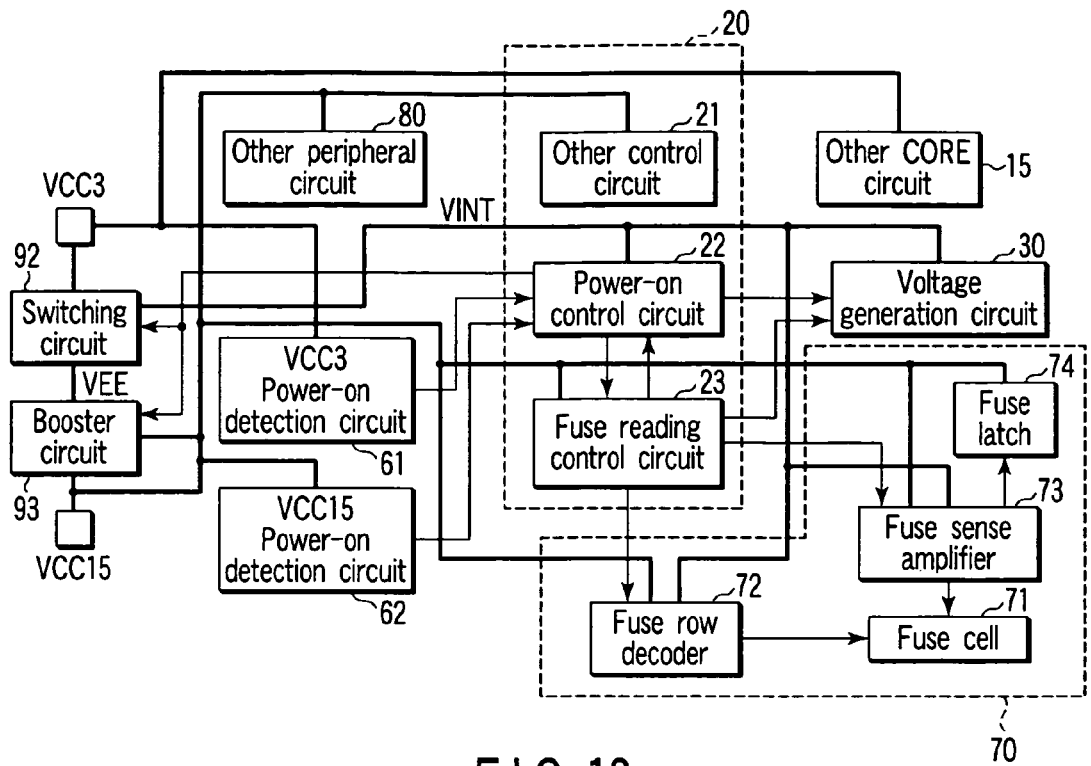
F I G. 12
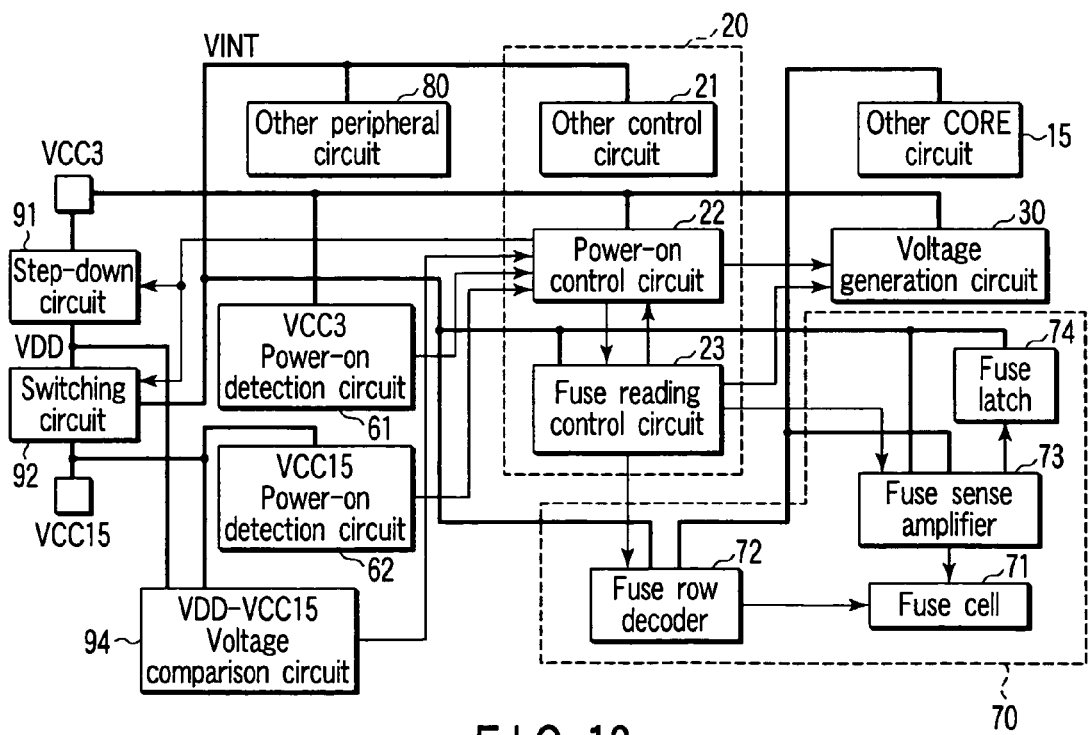
F I G. 13

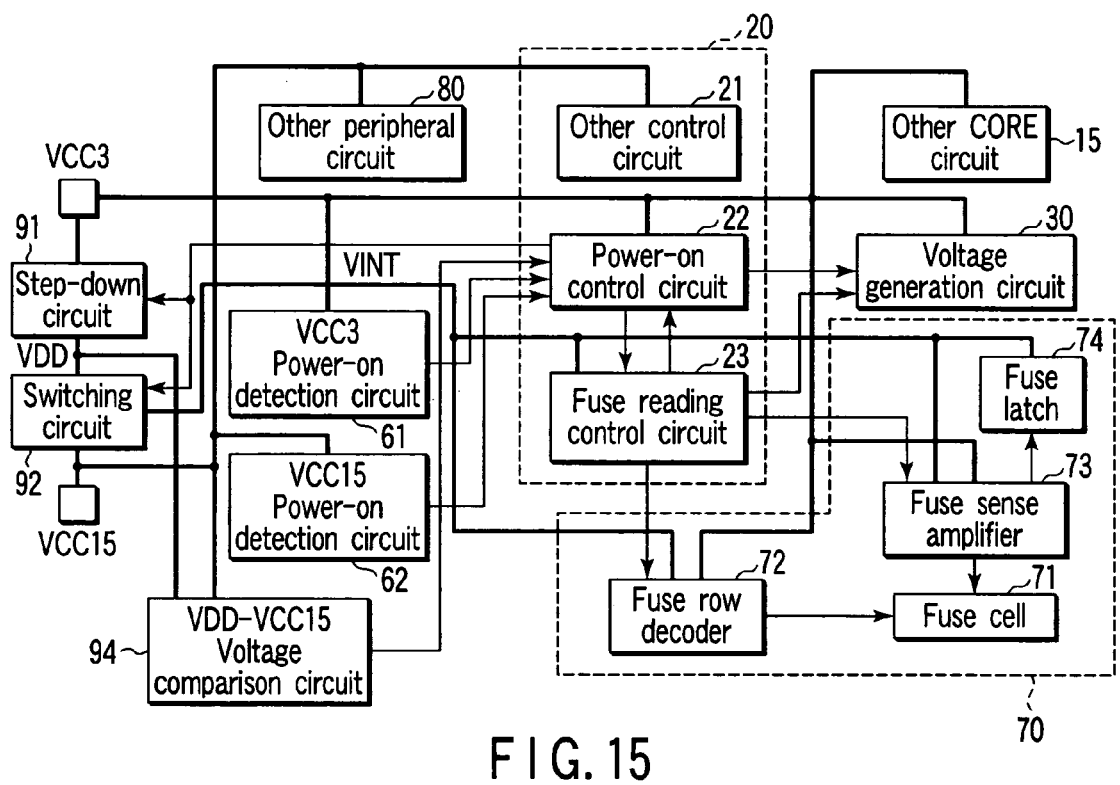
F I G. 15

SEMICONDUCTOR MEMORY DEVICE

CROSS-REFERENCE TO RELATED APPLICATIONS

This application is based upon and claims the benefit of priority from prior Japanese Patent Application No. 2005-183237, filed Jun. 23, 2005, the entire contents of which are incorporated herein by reference.

BACKGROUND OF THE INVENTION

1. Field of the Invention

The present invention relates to a semiconductor memory device.

2. Description of the Related Art

In a semiconductor memory device, a fuse element is provided to store redundancy address data when a defective memory cell is replaced by a redundant memory cell and the latter is then used, or control data for controlling the switch of voltage options for adjusting various voltage values used in an internal circuit.

Recently, there has been an increase in number of semiconductor memories which use storage elements similar in structure to memory cells for storing original data as such fuse elements. Especially, in the case of a nonvolatile memory such as a flash memory, a normal nonvolatile memory cell is directly used as a fuse cell.

A conventional semiconductor memory device equipped with such a fuse element, e.g., a mixed memory, is driven by two power sources, i.e., a 1.5V power source compatible to a CMOS logic, and a 3V power source for guaranteeing an analog circuit necessary to operate the semiconductor memory device. Because of the configuration of the two power sources, there are two detection circuits of 1.5V and 3V regarding a power-on detection circuit for detecting a voltage. Accordingly, when a fuse reading operation (chip initializing operation) is carried out, a power supply voltage level is determined by both detection circuits. Then, the fuse reading operation is started to read redundancy information of a chip stored in the fuse cell or information such as voltage trimming data.

For detection levels of the 3V and 1.5V power-on detection circuits, they must be designed not to exceed the lower limit VCCmin of a power supply voltage specification regardless of variance of the circuits. Furthermore, power-on detection levels must be designed to be higher than the operation lower limits of all circuits. Furthermore, since the memory device operates with two power supplies, it needs to be designed so that the circuits operate without problems under all considerable conditions for turning ON power supplies regardless of the turning ON order of the 1.5V and 3V power sources. For example, when data is read from the fuse cell, according to minimum power supply specifications of 1.5V, a fuse reading operation must be guaranteed at 0.8V considering 1.35V of the specifications, 1.25V at testing time, and a variance of 0.8 to 1.2V at the power-on detection circuit. When power supply specifications of 3V are in the range of 2.7V to 3.6V, considering a case in which a power supply voltage of 3V reaches sufficiently high 3.6V, fuse cell reading operations must be guaranteed under conditions of 0.8V in the case of 1.5V, and 3.6V in the case of 3V.

In reality, however, level changing from 0.8V to 3.6V which is larger by four times or more is difficult to achieve, and current balance of a 0.8V driving MOS transistor and a 3.6V driving MOS transistor is very lopsided even if it is achieved. An operation speed of a level changing circuit is consequently reduced. As the power-on circuit of a variance of 0.8V to 1.2V presumed here is 1.0±0.2V, it is not so large for the variance of the detection circuit. Thus, even if the power-on circuit of a small variance can be realized, VCC-min of the level changing circuit cannot be guaranteed, necessitating to guarantee the VCCmin of the level changing circuit by a conventional large-variance power-on circuit varied in the same direction as that of a variance of a transistor of the level changing circuit. As a result, the small-variance power-on detection circuit for guaranteeing fuse reading and the conventional large-variance power-on circuit are used together to guarantee VCCmin, constituting redundant circuitry. While the level changing circuit can be guaranteed by the conventional power-on detection circuit, it is difficult to set a sufficiently high level as it is a circuit of a large variance. For a redundant circuit, a margin of a VCCmin guarantee of the level changing circuit is small, and reliability is not so high. Further, as the level changing circuit is a circuit of the current of the MOS transistor, and the lower limit of the power supply voltage is different from that of the fuse reading circuit or the power-on detection circuit, circuit designing is difficult and, especially for examination of the fuse reading circuit, circuit designing is more difficult as there are two kinds of power supply voltages.

BRIEF SUMMARY OF THE INVENTION

According to an aspect of the invention, there is provided a semiconductor memory device comprising: a first power source which generates a first power supply voltage; a second power source which generates a second power supply voltage; a generation circuit which generates a third power supply voltage from the first power supply voltage; a switching circuit which selects one of the second power supply voltage and the third power supply voltage; and a fuse circuit connected to the switching circuit and equipped with a fuse element to carry out a fuse reading operation, wherein the third power supply voltage is supplied from the switching circuit to the fuse circuit during the fuse reading operation.

BRIEF DESCRIPTION OF THE SEVERAL VIEWS OF THE DRAWING

FIG. 12 is a circuit diagram of a semiconductor memory device according to a fourth embodiment of the present invention;

FIG. 13 is a circuit diagram of a semiconductor memory device according to a fifth embodiment of the present invention;

FIG. 15 is a circuit diagram of the semiconductor memory device according to the sixth embodiment of the present invention.

DETAILED DESCRIPTION OF THE INVENTION

The embodiments of the present invention will be described below in detail with reference to the accompanying drawings.

Figure 1:
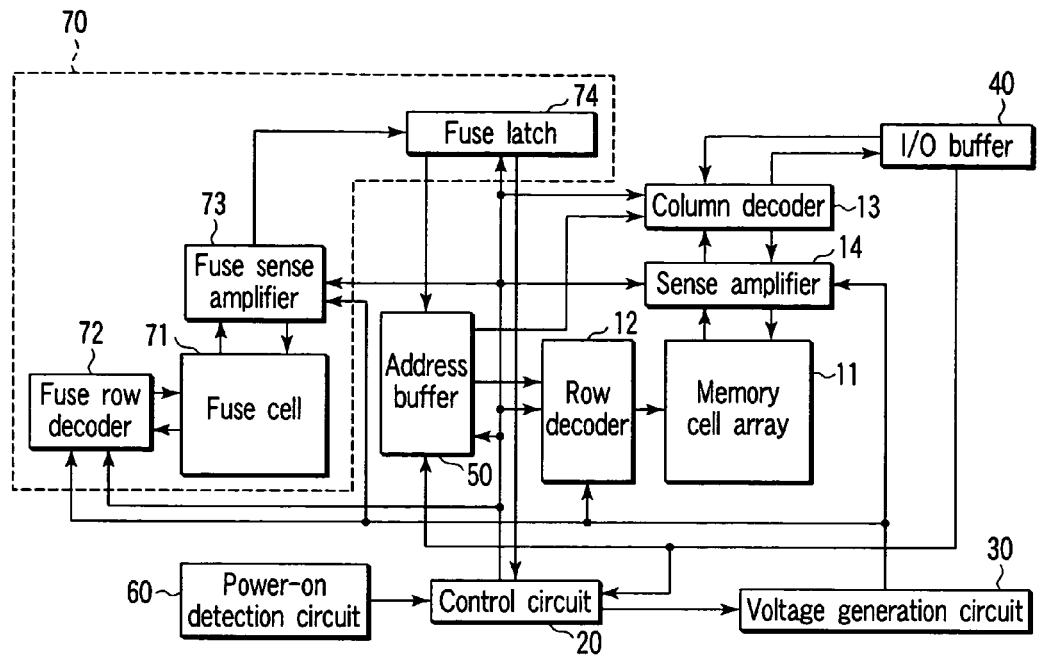
FIG. 1 is an outline diagram of a semiconductor memory device according to a first embodiment of the present invention.

FIG. 1 is an outline diagram of a semiconductor memory device according to a first embodiment.

In FIG. 1, the semiconductor memory device includes a memory cell array 11 for storing information, row and column decoders 12 and 13 for selecting memory cells, a sense amplifier 14 for converting an analog amount read from a memory cell into digital data, a control circuit 20 for generating a signal to control these components based on inputs from the outside, a voltage generation circuit 30 for generating a voltage necessary for a writing, erasing or reading operation, an input/output (I/O) buffer 40 for inputting an external signal or outputting read data to the outside, an address buffer 50 for storing an address to be accessed, a power-on detection circuit 60 necessary for initialization resetting when power is ON, and a fuse circuit 70 constituted of a fuse cell 71 for storing fuse data such as redundancy information of the semiconductor memory device, information for voltage trimming of each chip and the like, a fuse row decoder 72 for executing fuse data reading/writing operation, a fuse sense amplifier 73, and a fuse latch 74 for storing the fuse data.

Each of the memory cell array 11 and the fuse cell 71 may include a 2-transistor type flash memory constituted of a flash memory cell having one floating gate and one section gate transistor, or a nonvolatile memory such as a NAND type flash memory and a NOR type flash memory. Note that a memory cell is formed by laminating a floating gate and a control gate.

Figure 2:
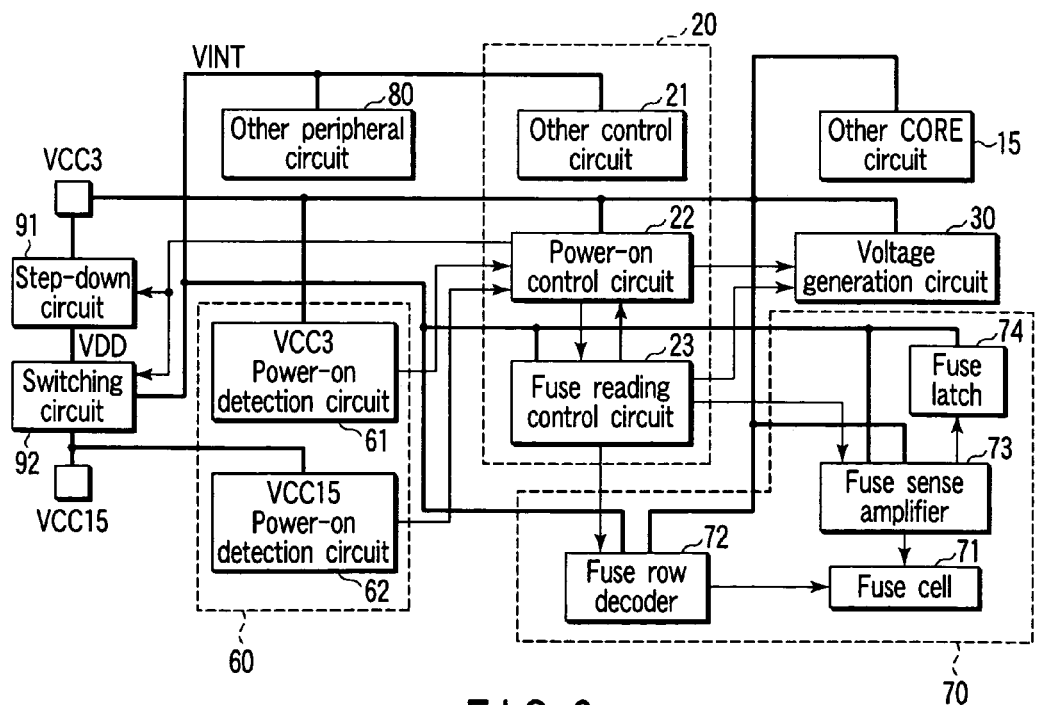
FIG. 2 is a circuit diagram of the semiconductor memory device of the first embodiment of the present invention.

FIG. 2 is a circuit diagram of the first embodiment. FIG. 2 specifically shows the fuse circuit 70, the control circuit 20, the voltage generation circuit 30, and the power-on detection circuit 60 in the circuitry of the semiconductor memory device of FIG. 1. The other circuit blocks are included in the other peripheral circuit 80, the other control circuit 21, and the other core circuit 15.

In FIG. 2, the semiconductor memory device shown in FIG. 1 includes a 3V power source VCC3 for driving an analog circuit such as the memory cell and the fuse cell, and a 1.5V power source VCC15 for driving a CMOS logic circuit. To detect these two power sources, the power-on detection circuit 60 includes two circuits, i.e., a power-on detection circuit 61 for the 3V VCC3 and a power-on detection circuit 62 for the 1.5V VCC15. The control circuit 20 of FIG. 1 includes a power-on control circuit 22 for receiving detection signals from the power-on detection circuit 61 for the VCC3 and the power-on detection circuit 62 for the VCC15 to output a fuse reading command or control the voltage generation circuit 30, a fuse reading control circuit 23 for receiving a command from the power-on control circuit 22 to output a reading command or control the fuse row decoder 72 and the fuse sense amplifier 73, and the other control circuit 21 for controlling the memory cell and the like. As in the case shown in FIG. 1, the fuse circuit 70 includes a fuse cell 71 for storing fuse data, a fuse row decoder 72 for executing a fuse data reading/writing operation, a fuse sense amplifier 73, and a fuse latch 74 for storing the fuse data.

A step-down circuit 91 for stepping down a 3V power supply voltage and a switching circuit 92 for switching the voltage stepped-down by the step-down circuit 91 and the 1.5V power source VCC15 are connected between the 3V power source VCC3 and the 1.5V power source VCC15. The power source VCC3 is connected to the VCC3 power-on circuit 61, the power-on control circuit 22, the voltage generation circuit 30, the fuse row decoder 72, the fuse sense amplifier 73, and the other core circuit 15 such as the memory cell to supply power thereto. The VCC15 power-on detection circuit 62 alone is connected to the power source VCC15, and voltage output from the switching circuit 92 is supplied to all the other VCC15 circuit blocks by a VINT node. The step-down circuit 91 and the switching circuit 92 can supply a stepped-down voltage VDD from the power source VCC3 to the 1.5V circuit blocks based on the control signal from the power-on control circuit 22 during a chip initialization operation.

Figure 3:
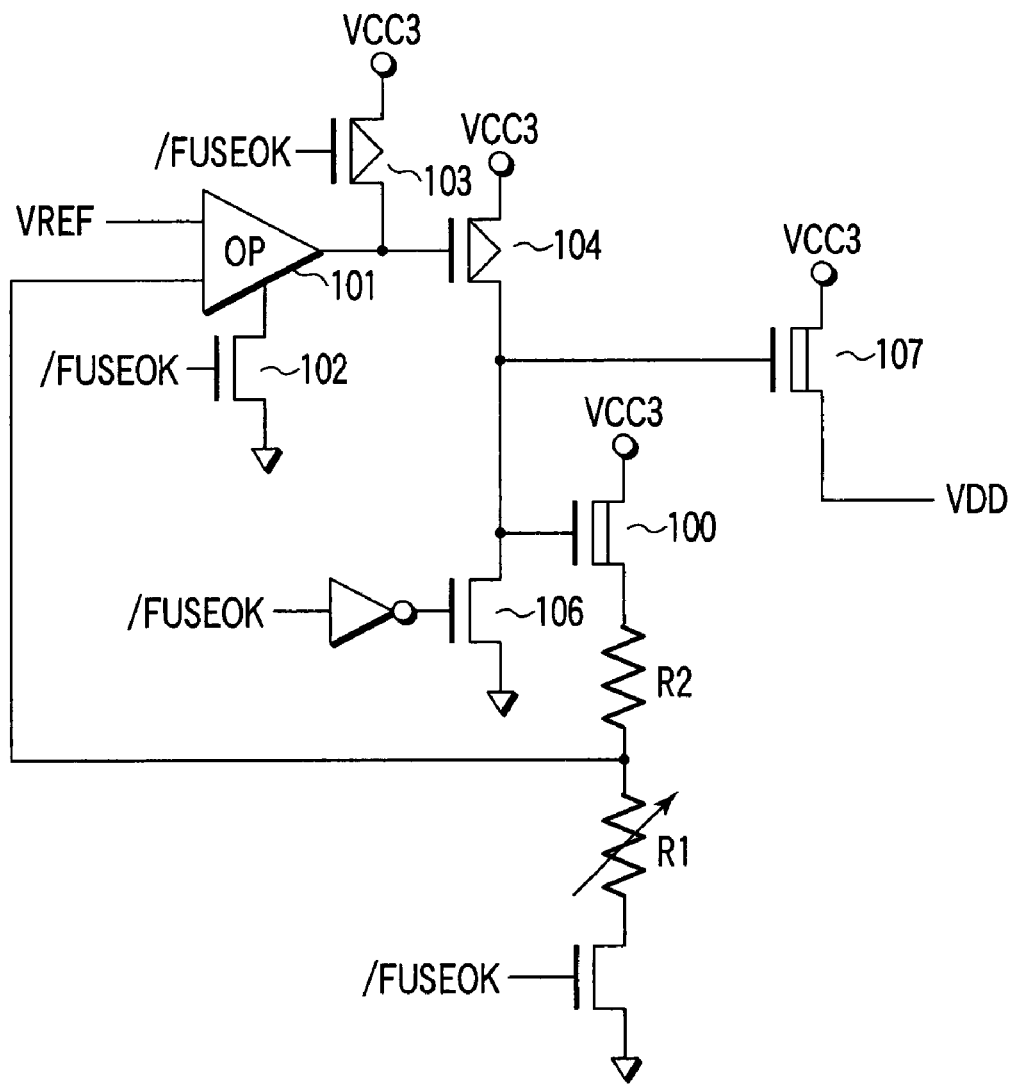
FIG. 3 is a circuit diagram showing a step-down circuit of the semiconductor memory device of the first embodiment of the present invention.
Figure 4:
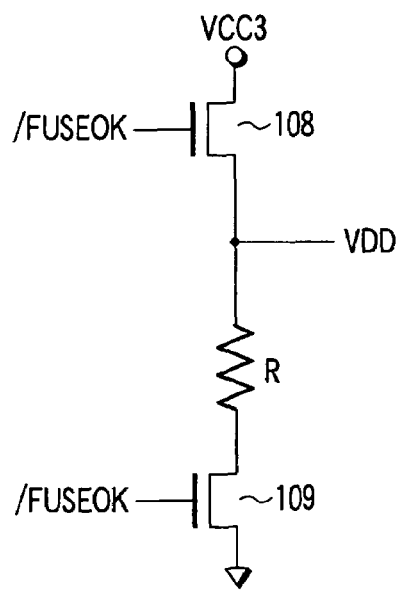
FIG. 4 is a circuit diagram showing the step-down circuit of the semiconductor memory device of the first embodiment of the present invention.

FIGS. 3 and 4 are exemplary circuit diagrams of the step-down circuit 91 of the first embodiment shown in FIG. 2.

The step-down circuit 91 of FIG. 3 includes a D-type transistor 100 having its drain side connected to the power source VCC3, resistance circuits R1, R2 connected to a source side of the D-type transistor 100, an operation amplifier 101 for comparing nodes resistance-divided by the resistance circuits R1, R2 with VREF, an NMOS transistor 102 for receiving an inversion signal/FUSEOK of a chip initialization completion signal to control the switch of a power source of the operation amplifier 101, a PMOS transistor 103 having the inversion signal/FUSEOK input to its gate, the power source VCC3 connected to its source side, and a node output from the operation amplifier 101 connected to its drain side, a PMOS transistor 104 having its source side connected to the power source VCC3 and the output node of the operation amplifier 101 input to its gate, a D-type transistor 107 having a node of the drain side of the PMOS transistor 104 connected to its gate and its drain side connected to the power source VCC3 to output a stepped-down voltage VDD, and an NMOS transistor 106 having a control signal FUSEOK input to its gate, its drain side connected to the node of the drain side of the PMOS transistor 104, and its source side connected to the ground.

By the resistance circuits R1, R2 serially connected to the D-type transistor 100, the resistance-divided node is compared with VREF at the operation amplifier 101. Accordingly, the step-down circuit 91 can generate an accurate stepped-down voltage VDD by adjusting the resistance circuits R1, R2 to generate a potential equal to that of a stepped-down voltage VDD at the node between the resistance circuits R1, R2 and the D-type transistor.

The step-down circuit of FIG. 4 is serially connected to an NMOS transistor 108, a resistor R, and an NMOS transistor 109 in this order from the power source VCC3 to the ground, and configured to output the stepped-down voltage VDD to the switching circuit from between the NMOS transistor 108 and the resistor R. This step-down circuit 91 generates a stepped-down voltage VDD by outputting a voltage lower than a threshold value Vth of the NMOS transistor 108 from the power source VCC3. An accurate voltage cannot be generated, but the stepped-down voltage VDD only needs to be a level which satisfies reliability and resistance of the 1.5V transistor, and in a range higher than fuse reading VCCmin.

FIGS. 5A to 5D are exemplary circuit diagrams of the switching circuit 92 of the first embodiment shown in FIG. 2.

Figure 5A:
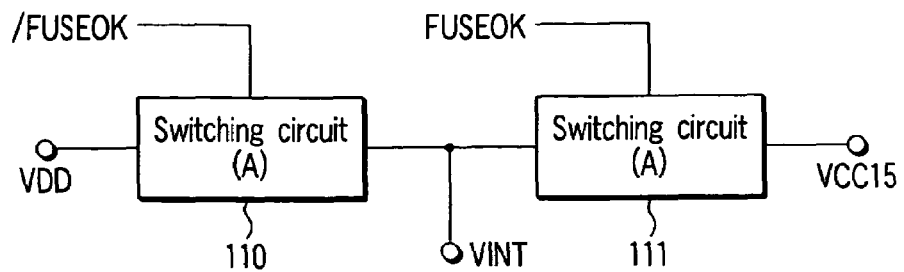
FIGS. 5A to 5D are circuit diagrams showing a switching circuit of the semiconductor memory device of the first embodiment of the present invention.

As shown in FIG. 5A, the switching circuit 92 includes a switching circuit 110 for connecting the voltage VDD stepped-down by the step-down circuit 91 based on the inversion signal /FUSEOK of the chip initialization completion signal to a VINT, and a switching circuit 111 for connecting the 1.5V power source VCC15 to the VINT based on the chip initialization completion signal FUSEOK.

Regarding an operation of the switching circuit 92, during the chip initialization operation, i.e., while the inversion signal /FUSEOK of the chip initialization completion signal is active, the switching circuit 110 is turned ON while the switching circuit 111 is turned OFF. Accordingly, the voltage VDD stepped-down by the step-down circuit 91 is connected to the VINT. Conversely, when the chip initialization operation is finished, the chip initialization completion signal FUSEOK is activated. Accordingly, the switching circuit 111 is turned ON to connect the power source VCC15 to the VINT.

Figure 5B:
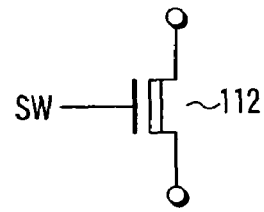
Figure 5C:
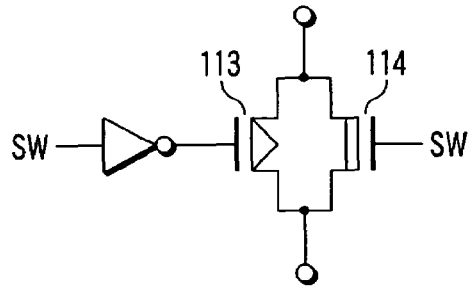
Figure 5D:
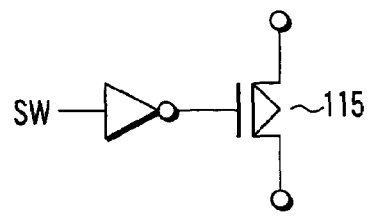

FIGS. 5B to 5D show examples of the switching circuits of the switching circuit shown in FIG. 5A. The example of the switching circuit below can be used for both of the switching circuits 110, 111.

As shown in FIG. 5B, the switching circuit is constituted of a D-type NMOS transistor 112, and a control signal SW is input to a gate of the D-type transistor 112. As shown in FIG. 5C, according to the second example of the switching circuit, the switching circuit is constituted of a PMOS transistor 113 and a D-type NMOS transistor 114, an inversion signal of the control signal SW is input to a gate of the PMOS transistor 113, and the control signal SW is input to a gate of the D-type NMOS transistor 114. As another example, as shown in FIG. 5D, the switching circuit is constituted of a PMOS transistor 115, and the inversion signal of the control signal SW is input to a gate of the PMOS transistor 115.

The control signal SW corresponds to the initialization completion signal FUSEOK or its inversion signal /FUSEOK shown in FIG. 5A. According to the embodiment, not only the D-type NMOS transistor but also an E-type NMOS transistor can be used for FIGS. 5B, 5C. In FIG. 5A, there are two switching circuits 110, 112. However, when the step-down circuit is configured to set a stepped-down voltage VDD to float during inactivation as in the case of the step-down circuit 91 of FIGS. 3, 4, the switching circuit 110 of FIG. 5A is not necessary.

Figure 6A:
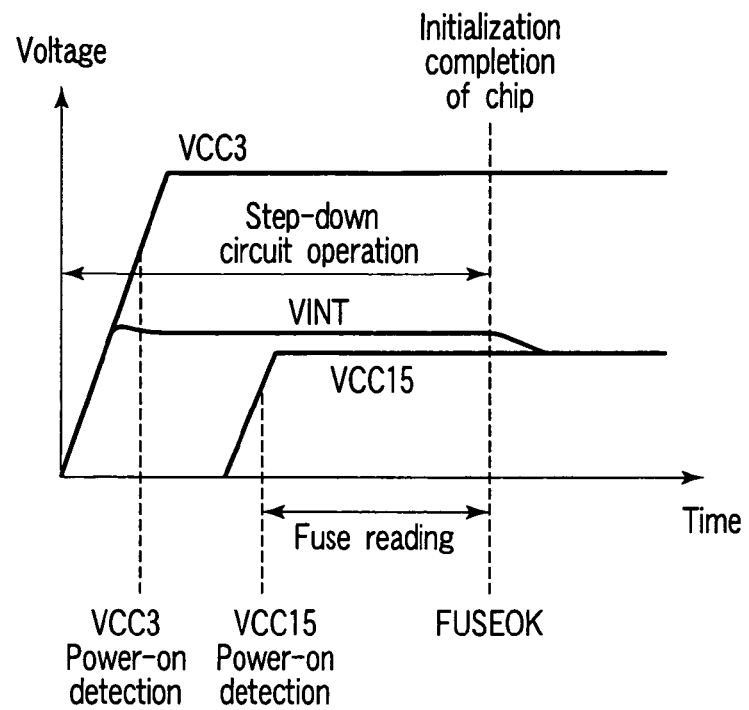
FIGS. 6A and 6B are diagrams showing a relation between a power supply voltage and time during a fuse reading operation of the semiconductor memory device of the first embodiment of the present invention.
Figure 6B:
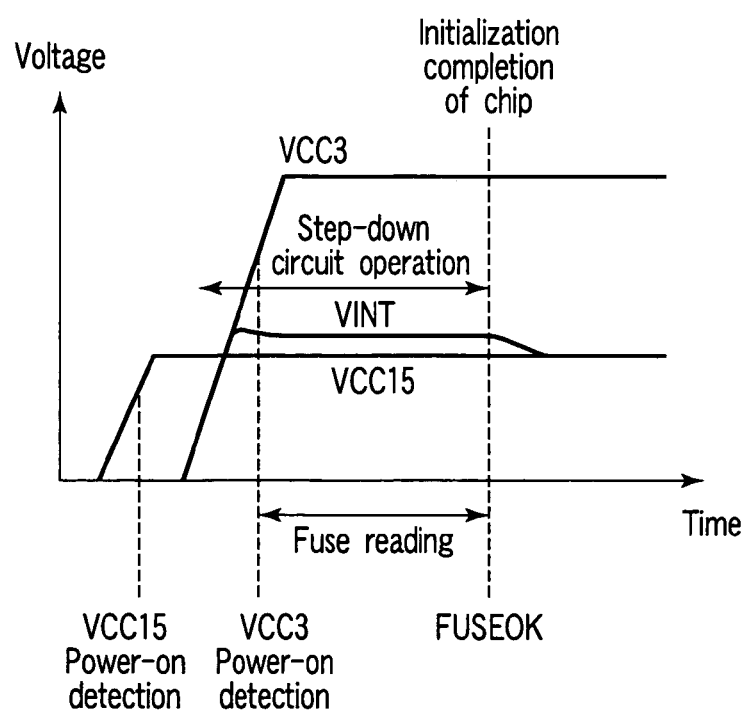

A chip initialization operation of the semiconductor memory device of the first embodiment will be described below based on a relation between a power supply voltage and time during the chip initialization operation of FIGS. 6A and 6B. FIG. 6A shows a case in which power is turned ON in order of the power source VCC3→the power source VCC15, and FIG. 6B shows a case in which power is turned ON in order of the power source VCC15→the power source VCC3.

In FIG. 6A, when the power source VCC3 is turned ON, the step-down circuit 91 is operated to generate a voltage nearly equal to that of the power source VCC15 at a VDD node. When a voltage of the power source VCC3 is detected by the VCC3 power-on detection circuit 61, the VCC3 power-on detection circuit 61 outputs a voltage rising signal of the power-on control circuit 22. Ideally, a stepped-down voltage VDD is preferably equal to that of the power source VCC15. However, this voltage basically needs to be in a voltage range permitted by the 1.5V transistor.

When the power source VCC15 is turned ON, and the VCC15 power-on detection circuit 62 detects a voltage of the power source VCC15, a voltage rising signal is output to the power-on control circuit 22, and the power-on control circuit 22 checks starting of both of the power sources VCC3, VCC15. Then, the power-on control circuit 22 issues a fuse reading command to the fuse circuit 70 to start fuse reading. During the fuse reading, the power source VCC15 is separated from the VINT node by the switching circuit 92, and connected to an output node VDD of the step-down circuit 91.

The operation of the step-down circuit is kept active until the fuse reading is finished. Upon an end of the fuse reading, a control signal FUSEOK indicating chip initialization completion is output from the power-on control circuit 22, a series of power-on operations are finished, the step-down circuit 91 is stopped, and the switching circuit 92 cuts off the stepped-down voltage VDD to connect the power source VDD15 to the VINT.

In the case of FIG. 6B, the power source VCC15 is first turned ON, and then the power source VCC3 is turned ON. At this time, the VINT is 0V until the power source VCC3 is turned ON, and after the power source VCC3 is turned ON, the step-down circuit 91 starts its operation to generate a voltage nearly equal to that of the power source VCC15 at the VDD node. A subsequent operation is similar to that of FIG. 6A.

In FIGS. 6A and 6B, one of the power sources VCC3, VCC15 is started first to generate the stepped-down voltage and to execute the fuse reading. However, the power sources VCC3, VCC15 can be simultaneously started. In this case, as in the case of the chip initialization operation, fuse reading is carried out from when power supplies of both are detected.

Thus, a VINT voltage can be increased by switching the power source VCC15 to the stepped-down voltage generated by the power source VCC3 during the chip initialization operation, and a problem of VCCmin of the level changing circuit can be prevented to increase an operation speed. Moreover, reliability of the fuse reading can be improved by increasing a margin with VCCmin, and circuit designing can be facilitated as the number of power supply voltages is one during the fuse reading.

Figure 7:
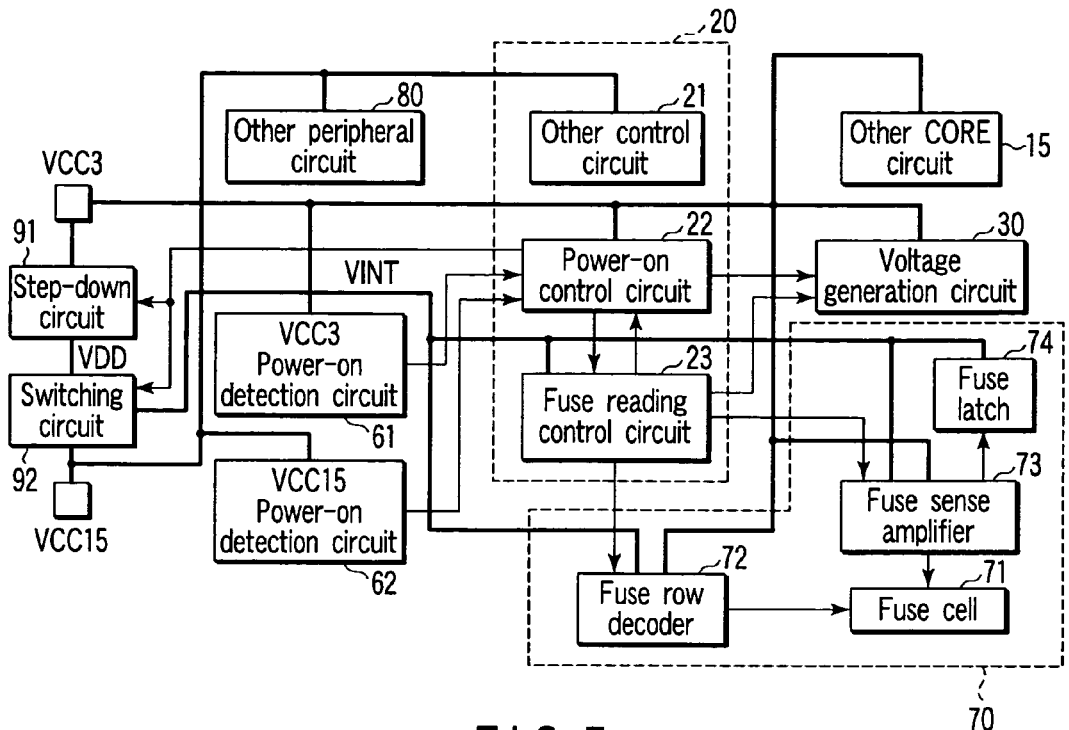
FIG. 7 is a circuit diagram of a semiconductor memory device according to a second embodiment of the present invention.

FIG. 7 is a circuit diagram of a semiconductor memory device according to a second embodiment. A difference of the second embodiment from the first embodiment is that each circuit is connected to a power source VCC15 according to the second embodiment while the power sources of the other peripheral circuit 80 and the other control circuit 21 are VINTs according to the first embodiment. In other words, according to the first embodiment, the power source VCC15 of a 1.5V circuit block is all the VINT nodes except for the VCC15 power-on detection circuit 62. According to the second embodiment, however, VINT is supplied to a power source alone of circuit blocks necessary for a chip initialization operation, i.e., a fuse reading control circuit 23, a fuse row decoder 72, a fuse sense amplifier 73, and a fuse latch 74.

With this configuration, because of circuitry for supplying a stepped-down voltage VDD to the power source alone of the circuit blocks necessary for the chip initialization operation, it is possible to facilitate designing of supply performance of a step-down circuit. As in the case of the first embodiment, a VINT power supply level can be increased during the initialization operation, and a problem of VCCmin of a level changing circuit can be prevented to increase an operation speed, and a margin with the VCCmin can be increased to improve reliability of fuse reading. Moreover, as the number of power supply voltages is one during the fuse reading, it is possible to facilitate circuit designing.

Figure 8:
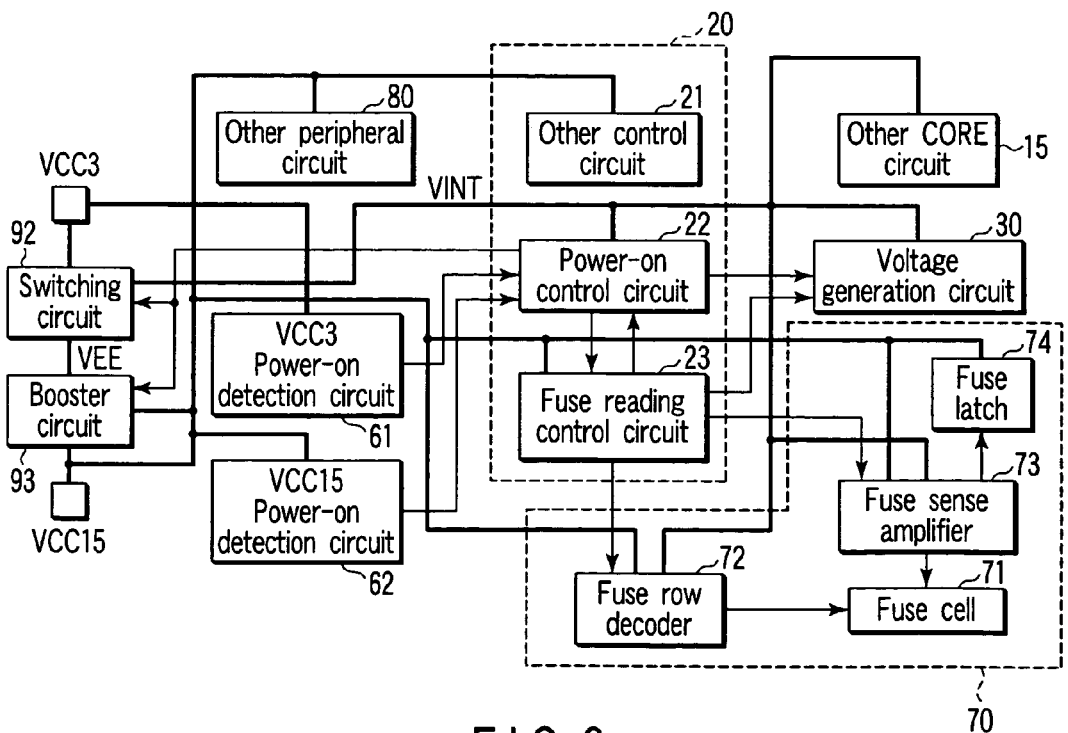
FIG. 8 is a circuit diagram of a semiconductor memory device according to a third embodiment of the present invention.

FIG. 8 is a circuit diagram of a semiconductor memory device according to a third embodiment. A difference of the third embodiment from the first embodiment is that a booster circuit 93 is disposed in a power source VCC15 side to boost a power supply voltage VCC15, a switching circuit 92 is disposed, and thereby a voltage VEE boosted from the power supply voltage VCC15 during a chip initialization operation is used for 3V circuit blocks while the voltage stepped-down by the step-down circuit 91 from the power source VCC3 during the chip initialization operation is used for the 1.5V circuit block according to each of the above embodiments. Thus, according to the third embodiment, the 1.5V circuit blocks are connected to the power source VCC15, and the boosted voltage VEE is supplied from the power source VCC3 or the booster circuit 93 to the 3V circuit blocks, i.e., a power-on control circuit 22, a voltage generation circuit 30, a fuse circuit 70, and the other core circuit 15 such as a memory cell other than a VCC3 power-on detection circuit 61, via the switching circuit 92.

Figure 9:
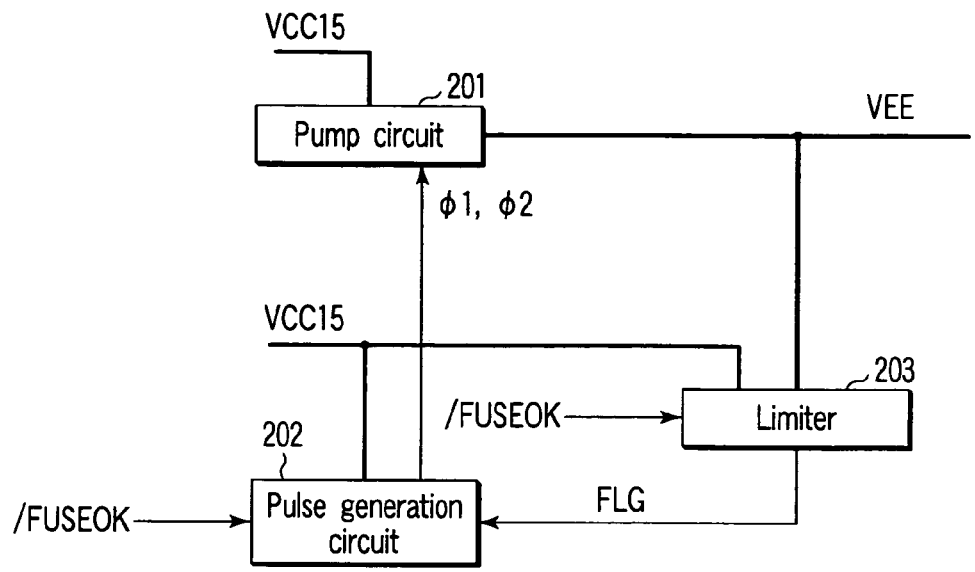
FIG. 9 is a circuit diagram showing a booster circuit of the semiconductor memory device of the third embodiment.

FIG. 9 shows an example of the booster circuit of the semiconductor memory device according to the third embodiment.

As shown in FIG. 9, a booster circuit 93 is operated by the power supply voltage VCC15, and constituted of a pump circuit 201 for boosting a power supply voltage from 1.5V, a pulse generation circuit 202 for sending pulse signals $\phi1$, $\phi2$ to the pump circuit 201, and a limiter 203 for sending a signal FLG to the pulse generation circuit 202 to stop pulse generation when the voltage boosted by the pump circuit 201 reaches a certain level or more. The pump circuit 201, the pulse generation circuit 202, and the limiter 203 are all connected to the power supply voltage VCC15.

Figure 10:
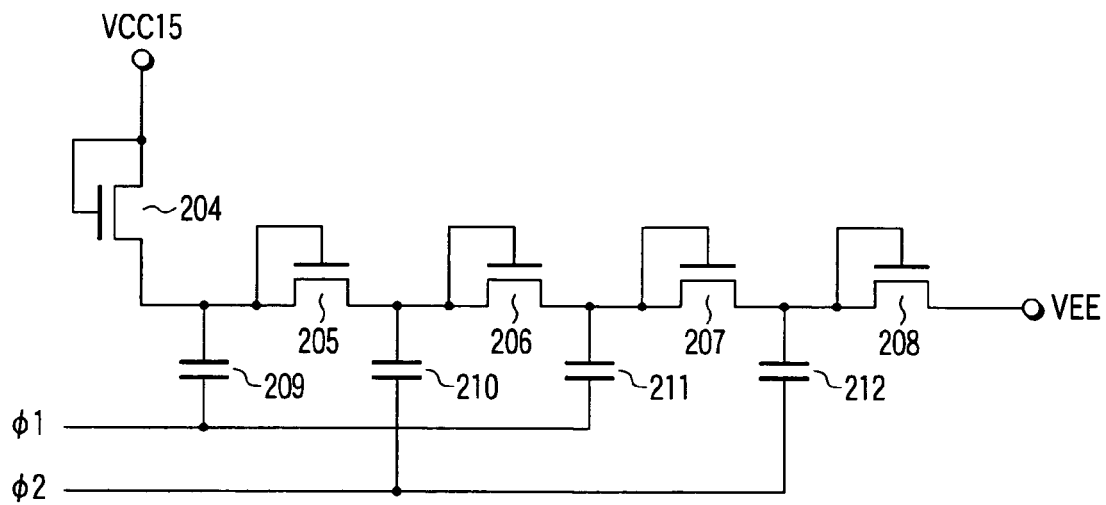
FIG. 10 is a circuit diagram showing a pump circuit of the booster circuit of the semiconductor memory device according to the third embodiment of the present invention.

FIG. 10 is an exemplary circuit diagram of the pump circuit.

As shown in FIG. 10, in the pump circuit 201, five NMOS transistors 204 to 208 are serially arranged from the power source VCC15 to VEE, and nodes of their drain sides are connected to gates of the NMOS transistors. Capacitors 209 to 212 are connected among the NMOS transistors 204 to 208, and pulse signals $\phi1$, $\phi2$, $\phi1$ and $\phi2$ are input to the capacitors 209 to 212 in order of those closer to the power source VCC15.

In the booster circuit 93, when a signal that is an activated inversion signal/FUSEOK of a chip initialization operation completion signal is input to start a chip initialization operation, the pulse generation circuit 202 and the limiter 203 start their operations, and the pulse generation circuit 202 generates a pulse signal $\phi1$ and its half-cycle delayed pulse signal $\phi2$ to input them to the pump circuit 201. The pump circuit 201 that has received the pulse signals $\phi1$, $\phi2$ starts boosting a voltage from the power source VCC15 in synchronization with the pulse signals $\phi1$, $\phi2$. The voltage VEE boosted by the pump circuit 201 is controlled by the limiter 203. When a certain voltage or more is reached, for example, about 2.5V according to the embodiment, the limiter 203 outputs a control signal FLG to the pulse generation circuit 202 to stop the pulse generation, whereby the boosted voltage VEE is adjusted to generate a boosted voltage VEE.

Figure 11A:
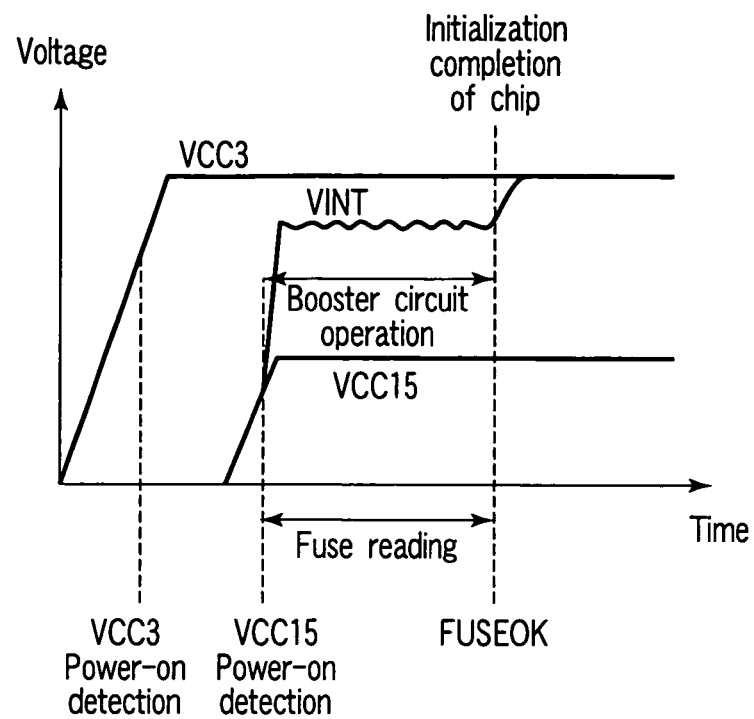
FIGS. 11A and 11B are diagrams showing a relation between a power supply voltage and time during a fuse reading operation of the semiconductor memory device of third embodiment of the present invention.
Figure 11B:
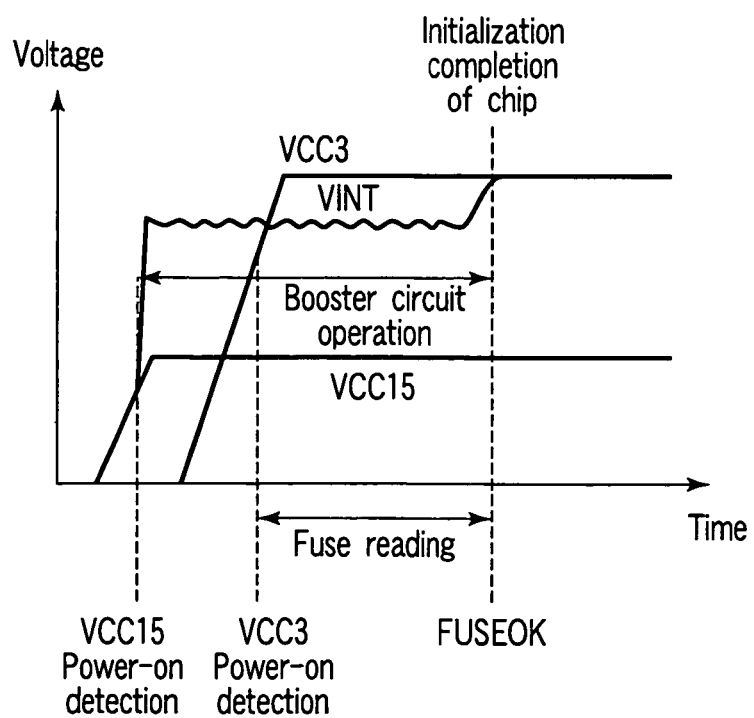

The chip initialization operation of the semiconductor memory device of the third embodiment will be described below based on a relation between a power supply voltage and time during the chip initialization operation of FIGS. 11A and 11B. FIG. 11A shows a case in which power is turned ON in order of the power source VCC3→the power source VCC15, and FIG. 11B shows a case in which power is turned ON in order of the power source VCC15→the power source VCC3.

As shown in FIG. 11A, when the power source VCC3 is turned ON to reach a rising VCC3 power-on detection level, an activated signal is input from the VCC3 power-on detection circuit 61 to the power-on control circuit 22.

When the power source VCC15 is turned ON to reach a VCC15 power-on detection level, the activated signal is input from the power-on control circuit 22 to the booster circuit 93. Then, the pulse generation circuit 202 for the pump circuit is operated to generate pulse signals $\phi1$, $\phi2$, and a boosted voltage VEE is generated at the pump circuit 201 by pumping based on the pulse signals. Subsequently, the power-on control circuit 22 sends a control signal for starting fuse reading to the switching circuit 92 and the fuse reading control circuit 23 to connect the boosted voltage VEE to the VINT, and the fuse circuit 70 starts a fuse reading operation.

In this case, the boosted voltage VEE must be in a range to satisfy an operation of an analog circuit which is a 3V circuit block.

Subsequently, the operation of the booster circuit 93 is continued until chip initialization operation is completed, and then connected to the power source VCC3 by the switching circuit 92 to become a power source from the external power source VCC3.

In FIGS. 11A, 11B, one of the power sources VCC3, VCC 15 is first started to generate the boosted voltage and to execute the fuse reading. However, the power sources VCC3, VCC15 can be simultaneously started. In this case, as in the case of the above chip initialization operation, fuse reading is carried out from when both power sources are detected.

With this configuration, as in the case of the first and second embodiments, a problem of VCCmin of the level changing circuit can be prevented to increase an operation speed, and reliability of the fuse reading can be improved by increasing a margin with VCCmin. Moreover, as the number of power supply voltages is one during the fuse reading, it is possible to facilitate circuit designing.

FIG. 12 is a circuit diagram of a semiconductor memory device according to a fourth embodiment.

The forth embodiment is different from the previous embodiments in that a power source using the boosted voltage VEE of the third embodiment is limited to a circuit related to an initialization operation. In other words, according to the third embodiment, the switching circuit 92 for switching the booster circuit 93 to boost the voltages from the power sources VCC3 and VCC15 is connected to the 3V circuit blocks. According to the fourth embodiment, however, in a switching circuit 92, a 3V circuit blocks are connected to a power-on control circuit 22, a voltage generation circuit 30, and a fuse circuit 70 related to a chip initialization operation, and the other core circuit 15 is directly connected to the power source VCC3.

With this configuration, as in the case of the third embodiment, the semiconductor memory device of the fourth embodiment can prevent a problem of VCCmin of a level changing circuit to increase an operation speed, and improve reliability of fuse reading by increasing a margin with VCCmin. Moreover, as the number of power supply voltages is one during the fuse reading, it is possible to facilitate circuit designing.

FIG. 13 is a circuit diagram of a semiconductor memory device according to a fifth embodiment.

The fifth embodiment is different from the previous embodiments in that a VDD-VCC15 voltage comparison circuit 94 is added to the circuitry of the first embodiment, a detection flag signal is issued to a power-on control circuit when a voltage level of an external power source VCC15 exceeds a stepped-down voltage VDD, and an operation of a step-down circuit 91 is stopped to connect the external power source VCC15 to VINT.

A chip initialization operation of the semiconductor memory device of the fifth embodiment will be described below based on a relation between a power supply voltage and time during the chip initialization operation of FIGS. 14A and 14B.

Figure 14A:
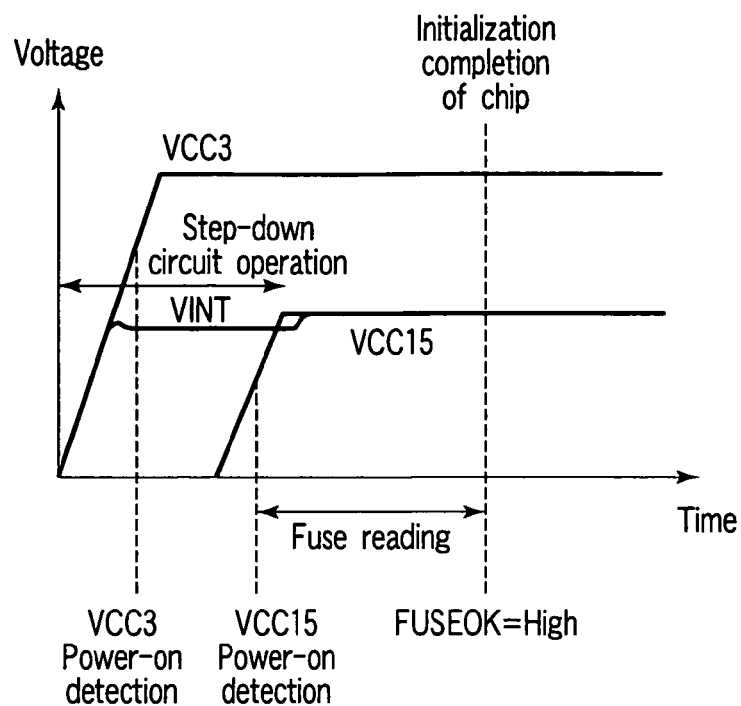
FIGS. 14A and 14B are diagrams showing a relation between a power supply voltage and time during a fuse reading operation of a semiconductor memory device according to a sixth embodiment of the present invention.
Figure 14B:
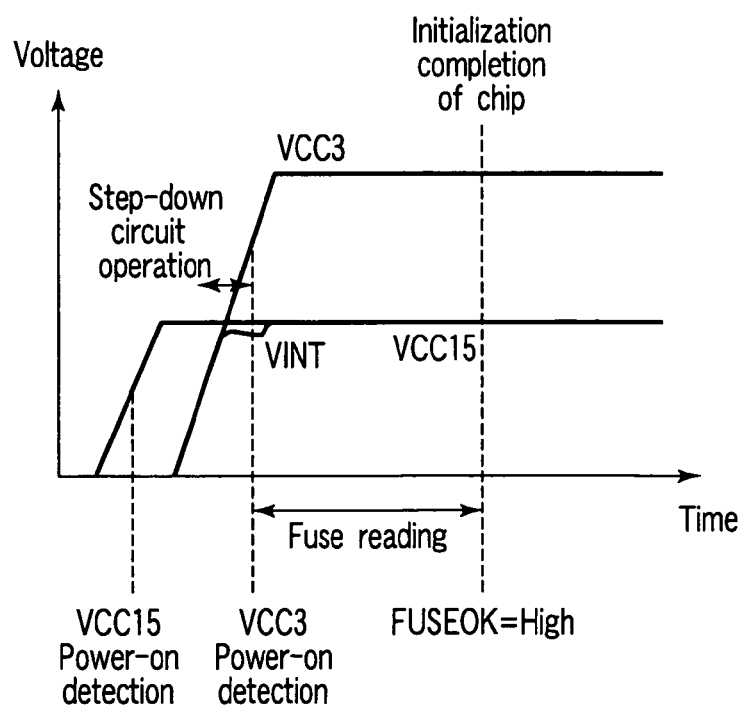

FIG. 14A shows a case in which power is turned ON in order of the power source VCC3→the power source VCC15, and FIG. 14B shows a case in which power is turned ON in order of the power source VCC15→the power source VCC3.

In FIG. 14A, when the power source VCC3 is turned ON, a step-down circuit 91 is operated to generate a voltage nearly equal to that of the power source VCC15 at a VDD node. When the power source VCC3 is turned ON, and a voltage of the power source VCC3 reaches a detection level, and is detected by a VCC3 power-on detection circuit 61, the VCC3 power-on detection circuit 61 outputs a voltage rising signal of a power-on control circuit 22. Ideally, a stepped-down voltage VDD is preferably equal to that of the power source VCC15. However, this voltage may need to be only in a voltage range permitted by a 1.5V transistor.

When the power source VCC15 is turned ON, and a VCC15 power-on detection circuit 62 detects a voltage of the power source VCC15, a voltage rising signal is output to the power-on control circuit 22, and the power-on control circuit 22 checks starting of both of the power sources VCC3 and VCC15. Then, the power-on control circuit 22 issues a fuse reading command to a fuse circuit 70 to start fuse reading. Subsequently, when a VDD-VCC15 voltage comparison circuit 94 judges that a voltage of the power source VCC15 exceeds a voltage VDD generated from a step-down circuit 91, a control signal indicating this is sent from the VDD-VCC15 voltage comparison circuit 94 to the power-on control circuit. Then, the power-on control circuit 22 outputs a control signal for connection with the power source VCC15 to a switching circuit 92, whereby the VINT is connected to the power source VCC15. Accordingly, during fuse reading, a VINT node may be connected to an output node VDD of the step-down circuit 91 or the power source VCC15.

When the VINT node is connected to the VCC15 based on the control signal from the VDD-VCC15 voltage comparison circuit 94, an operation of the step-down circuit 91 is finished. Then, by the power source VCC15, the fuse reading is continued, and the fuse reading is completed.

In the case of FIG. 14B, the power source VCC15 is first turned ON, and then the power source VCC3 is turned ON. When the VCC3 is started, the step-down circuit 91 starts its operation to generate a voltage nearly equal to that of the power source VCC15 at the VDD node. A subsequent operation is similar to that of FIG. 14A.

In FIGS. 14A and 14B, one of the power sources VCC3 and VCC15 is started first to generate the stepped-down voltage and to execute the fuse reading. However, the power sources VCC3, VCC15 can be simultaneously started. In this case, as in the case of the chip initialization operation, fuse reading is carried out from when power supplies of both are detected.

With this configuration, as in the case of the first and second embodiments, a VINT voltage can be increased during the fuse reading operation, and a problem of VCCmin of the level changing circuit can be prevented, and reliability of the fuse reading can be improved. Because of one externally-applied voltage, circuit design can be facilitated. By disposing the VDD-VCC15 voltage comparison circuit 94, time for operating the step-down circuit can be shortened more as compared with the above embodiments. Hence, it is possible to reduce current consumption.

FIG. 15 is a circuit diagram of a semiconductor memory device according to a sixth embodiment. A difference of the sixth embodiment from the fifth embodiment is that each circuit is connected to a power source VCC15 according to the sixth embodiment while the power sources of the other peripheral circuit 80 and the other control circuit 21 are VINTs according to the fifth embodiment. In other words, according to the fifth embodiment, the power source VCC15 of a 1.5V circuit block is all the VINT nodes except for the VCC15 power-on detection circuit 62. According to the sixth embodiment, however, VINT is supplied to a power source alone of circuit blocks necessary for a chip initialization operation, i.e., a fuse reading control circuit 23, a fuse row decoder 72, a fuse sense amplifier 73, and a fuse latch 74.

With this configuration, because of circuitry for supplying a stepped-down voltage VDD to the power source alone of the circuit blocks necessary for the chip initialization operation, it is possible to facilitate designing of supply performance of a step-down circuit 91. As in the case of the first embodiment, a VINT power supply level can be increased during the initialization operation, a problem of VCCmin of a level changing circuit can be prevented to increase an operation speed, and a margin with the VCCmin can be increased to improve reliability of fuse reading. Moreover, by disposing a VDD-VCC15 voltage comparison circuit 94, time for operating the step-down circuit 91 can be shortened more as compared with the above embodiments, and thus it is possible to reduce current consumption.

According to the fifth and sixth embodiments, by using the VDD-VCC15 voltage comparison circuit 94, the VINT can be switched for its connection from the VDD to the power source VCC15 when the voltage of the power source VCC15 exceeds a voltage value of the VDD. However, in place of the VDD-VCC15 voltage comparison circuit 94, it can be realized by a second VCC15 power-on detection circuit for detecting a voltage of the VCC15 higher than a detection level of the VCC15 power-on circuit 62. In other words, when the second VCC15 power-on detection circuit judges that a voltage of the power source VCC15 reaches a detection level higher than that of the VCC15 power-on detection circuit 62, e.g., a range of 1.5±0.2V, effects similar to those of the above embodiments can be expected by the switching circuit even when the VINT is connected to the power source VCC15. In this case, the second VCC15 power-on detection circuit is connected to the power source VCC15 alone.

According to the embodiments, in the semiconductor memory device driven by the two external power sources to store fuse data in the memory cell, it is possible to guarantee a power supply voltage during the fuse reading when power is turned ON, to improve reliability, and to facilitate designing of a fuse reading circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first power source which generates a first power supply voltage;
   a second power source which generates a second power supply voltage;
   a generation circuit which generates a third power supply voltage from the first power supply voltage;
   a switching circuit which selects one of the second power supply voltage and the third power supply voltage;
   a fuse circuit connected to the switching circuit and equipped with a fuse element to carry out a fuse reading operation;
   a first voltage detection circuit which detects the first power supply voltage; and
   a second voltage detection circuit which detects the second power supply voltage,
   wherein the third power supply voltage is supplied from the switching circuit to the fuse circuit during the fuse reading operation, and
   the third power supply voltage is supplied to the fuse circuit when the first power supply voltage is detected by the first voltage detection circuit.

2. The semiconductor memory device according to claim 1, wherein the first power supply voltage is larger than the second power supply voltage, and the generation circuit is a step-down circuit to step down the first power supply voltage.

3. The semiconductor memory device according to claim 1, wherein the first power supply voltage is smaller than the second power supply voltage, and the generation circuit is a booster circuit to boost the first power supply voltage.

4. The semiconductor memory device according to claim 1, wherein the fuse element stores redundancy address data or control data to control the switch of voltage options.

5. The semiconductor memory device according to claim 1, wherein the fuse element is a nonvolatile memory.

6. The semiconductor memory device according to claim 1,
   wherein the fuse reading operation is started when the first and second power supply voltages are detected by the first and second voltage detection circuits.

7. The semiconductor memory device according to claim 6, wherein the fuse reading operation is started after the first power supply voltage is detected by the first voltage detection circuit and then the second power supply voltages is detected by the second voltage detection circuit.

8. The semiconductor memory device according to claim 6, wherein the fuse reading operation is started after the second power supply voltage is detected by the second voltage detection circuit and then the first power supply voltages is detected by the first voltage detection circuit.

9. The semiconductor memory device according to claim 2, wherein the voltage stepped down from the first power supply voltage by the step-down circuit is supplied to a power source alone of a circuit block necessary for chip initialization operation.

10. The semiconductor memory device according to claim 3, wherein the voltage boosted from the second power supply voltage by the booster circuit is supplied to a power source alone of a circuit block necessary for chip initialization operation.

11. The semiconductor memory device according to claim 1, further comprising a voltage comparison circuit which compares the second and third power supply voltages with each other,
    wherein the switching circuit switches voltage supply to the fuse circuit from the third power supply voltage to the second power supply voltage when the voltage comparison circuits detects that the second power supply voltage is larger than the third power supply voltage.

12. The semiconductor memory device according to claim 6, further comprising a third voltage detection circuit which detects the second power supply voltage,
    wherein the switching circuit switches voltage supply to the fuse circuit from the third power supply voltage to the second power supply voltage when the second voltage detection circuit detects the third power supply voltage.

13. The semiconductor memory device according to claim 1, wherein the semiconductor memory device is a nonvolatile memory.

14. The semiconductor memory device according to claim 1, wherein the semiconductor memory device is a NAND type flash memory.

15. A semiconductor memory device comprising:
    a first power source which generates a first power supply voltage;
    a second power source which generates a second power supply voltage;
    a generation circuit which generates a third power supply voltage from the first power supply voltage;
    a switching circuit which selects one of the second power supply voltage and the third power supply voltage;
    a fuse circuit connected to the switching circuit and equipped with a fuse element to carry out a fuse reading operation;
    a first voltage detection circuit which detects the first power supply voltage; and
    a second voltage detection circuit which detects the second power supply voltage, wherein the third power supply voltage is supplied from the switching circuit to the fuse circuit during the fuse reading operation, and the fuse reading operation is started when the first and second power supply voltages are detected by the first and second voltage detection circuits.

16. The semiconductor memory device according to claim 15, wherein the fuse reading operation is started after the first power supply voltage is detected by the first voltage detection circuit and then the second power supply voltages is detected by the second voltage detection circuit.

17. The semiconductor memory device according to claim 15, wherein the fuse reading operation is started after the second power supply voltage is detected by the second voltage detection circuit and then the first power supply voltages is detected by the first voltage detection circuit.

18. The semiconductor memory device according to claim 15, further comprising a third voltage detection circuit which detects the second power supply voltage, wherein the switching circuit switches voltage supply to the fuse circuit from the third power supply voltage to the second power supply voltage when the second voltage detection circuit detects the third power supply voltage.

19. The semiconductor memory device according to claim 15, wherein the semiconductor memory device is a nonvolatile memory.

20. A semiconductor memory device comprising:

a first power source which generates a first power supply voltage;

a second power source which generates a second power supply voltage;

a generation circuit which generates a third power supply voltage from the first power supply voltage;

a switching circuit which selects one of the second power supply voltage and the third power supply voltage;

a fuse circuit connected to the switching circuit and equipped with a fuse element to carry out a fuse reading operation; and a voltage comparison circuit which compares the second and third power supply voltages with each other, wherein the third power supply voltage is supplied from the switching circuit to the fuse circuit during the fuse reading operation, and the switching circuit switches voltage supply to the fuse circuit from the third power supply voltage to the second power supply voltage when the voltage comparison circuits detects that the second power supply voltage is larger than the third power supply voltage.

21. The semiconductor memory device according to claim 20, wherein the semiconductor memory device is a nonvolatile memory.

* * * * *